(12) United States Patent
Thiagarajan et al.

(10) Patent No.: US 10,243,531 B1
(45) Date of Patent: Mar. 26, 2019

(54) APPARATUS AND METHOD FOR CENTRALLY CONTROLLING COMMON MODE VOLTAGES FOR A SET OF RECEIVERS

(71) Applicant: QUALCOMM Incorporated, San Diego, CA (US)

(72) Inventors: Pradeep Thiagarajan, Chapel Hill, NC (US); Xiaobin Yuan, Cary, NC (US); Todd Morgan Rasmus, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 18 days.

(21) Appl. No.: 15/701,072

(22) Filed: Sep. 11, 2017

(51) Int. Cl.
*H03F 3/45* (2006.01)
*H03G 3/30* (2006.01)

(52) U.S. Cl.
CPC .............. *H03G 3/30* (2013.01); *H03F 3/4521* (2013.01); *H03F 3/45183* (2013.01); *H03F 3/45475* (2013.01); *H03F 3/45659* (2013.01)

(58) Field of Classification Search
CPC ........... H03F 3/45672; H03F 2200/456; H03F 2200/555; H03F 2203/45154; H03F 2203/45156; H03F 3/45197; H03F 2200/411; H03F 2203/45418; H03F 2200/453; H03F 3/45708; H03F 1/34; H03G 3/004; H03G 1/0029
USPC ........................................ 330/254, 258, 261
See application file for complete search history.

(56) References Cited

U.S. PATENT DOCUMENTS

| 6,975,170 | B2 | 12/2005 | Lin et al. |
| 8,115,544 | B2 | 2/2012 | Trauth et al. |
| 8,258,869 | B2 * | 9/2012 | Zhao ........................ H03F 1/223 330/254 |
| 8,552,801 | B2 | 10/2013 | Myles |
| 9,231,731 | B1 | 1/2016 | Nguyen et al. |
| 9,397,623 | B1 * | 7/2016 | Lacroix .................... H03F 3/193 |
| 9,577,593 | B2 * | 2/2017 | Chiu ........................ H03F 1/086 |
| 9,647,618 | B1 * | 5/2017 | Yuan ....................... H03G 3/004 |

(Continued)

OTHER PUBLICATIONS

Kimura H., et al., "A 28 Gb/s 560 mW Multi-Standard SerDes With Single-Stage Analog Front-End and 14-Tap Decision Feedback Equalizer in 28 nm CMOS," IEEE Journal of Solid-state Circuits, Dec. 2014, vol. 49, No. 12, pp. 3091-3103.

*Primary Examiner* — Khanh V Nguyen

(74) *Attorney, Agent, or Firm* — Loza & Loza, LLP/Qualcomm

(57) ABSTRACT

A differential signal processing circuit includes a local common mode voltage control circuit for controlling a common mode voltage of an output differential signal generated by the differential signal processing circuit based on an external common mode control current generated by an external common mode voltage control circuit. The differential signal processing circuit, which may be configured as a variable gain amplifier (VGA) or a continuous time linear equalizer (CTLE), includes a pair of load devices, a pair of input transistors, and a pair of current source transistors coupled via separate paths between upper and lower voltage rails. The external control circuit includes a replica circuit including a replica load device, a replica input transistor, and a replica current source transistor. The external control circuit sets the replica common mode voltage to a target using a current, wherein the external common mode control current is based on that current.

25 Claims, 7 Drawing Sheets

(56) References Cited

U.S. PATENT DOCUMENTS

2009/0251227 A1 10/2009 Jasa
2012/0139638 A1* 6/2012 Kaviani ............. H03F 3/45183
　　　　　　　　　　　　　　　　　　　330/289

* cited by examiner

US 10,243,531 B1

APPARATUS AND METHOD FOR CENTRALLY CONTROLLING COMMON MODE VOLTAGES FOR A SET OF RECEIVERS

FIELD

Aspects of the present disclosure relate generally to common mode voltage control, and in particular, to an apparatus and method for controlling common mode voltages for a set of one or more receivers.

BACKGROUND

A differential signal includes an associated common mode voltage. The common mode voltage is typically defined as the voltage midway between the voltage corresponding to a high logic state and the voltage corresponding to a low logic state of the differential signal. Due to various imperfections in analog signal processing circuits, the common mode voltage of a differential signal may vary. In some cases, the variation in the common mode voltage of a differential signal is large enough that it creates problems for a circuit configured to process the differential signal.

Accordingly, there is a need for controlling a common mode voltage of a differential signal to prevent operational errors in circuits configured to process the differential signal.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus having a differential signal processing circuit including a first load device, a first input transistor, and a first current source transistor coupled in series between a first upper voltage rail and a lower voltage rail, wherein the first input transistor includes a first gate configured to receive a positive component of an input differential signal and a first drain configured to produce a negative component of an output differential signal, and a second load device, a second input transistor, and a current control source transistor coupled in series between the first upper voltage rail and the lower voltage rail, wherein the second input transistor includes a second gate configured to receive a negative component of the input differential signal and a second drain configured to produce a positive component of the output differential signal; and a local common mode voltage control circuit configured to receive an external common mode control current and generate therefrom a bias voltage for gates of the first and second current source transistors for setting a common mode voltage of the output differential signal to substantially a target common mode voltage.

Another aspect of the disclosure relates to a method including generating an output differential signal based on an input differential signal; receiving an external common mode voltage control current; and generating a bias voltage for controlling a common mode voltage of the output differential signal based on the external common mode control current.

Another aspect of the disclosure relates to apparatus including means for generating an output differential signal based on an input differential signal; means for receiving an external common mode voltage control current; and means for generating a bias voltage for controlling a common mode voltage of the output differential signal based on the external common mode control current.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
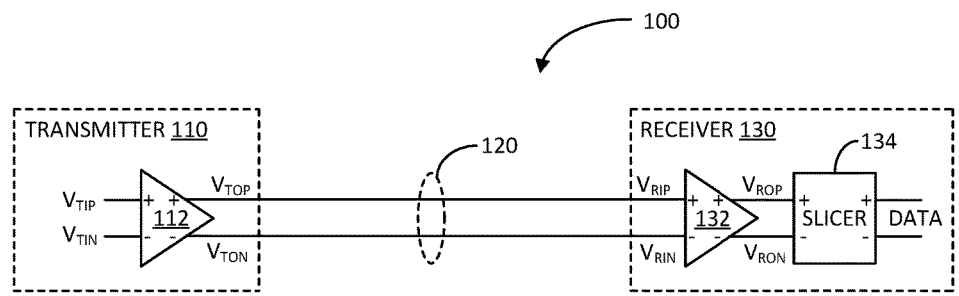
FIG. 1A illustrates a block diagram of an exemplary data communication system in accordance with an aspect of the disclosure.

FIG. 1A illustrates a block diagram of an exemplary data communication system 100 in accordance with an aspect of the disclosure. The data communication system 100 includes a transmitter 110, a receiver 130, and a transmission line 120 coupling the transmitter to the receiver.

The transmitter 110 includes an input/output (I/O) driver 112 configured to receive an input differential transmit signal including positive component $V_{TIP}$ and negative component $V_{TIN}$ and generate therefrom an output differential transmit signal including positive component $V_{TOP}$ and negative component $V_{TON}$. For example, the input differential transmit signal $V_{TIP}/V_{TIN}$ may be in a lower voltage domain suitable for processing by a core of an integrated circuit (IC). The I/O driver 112 may level shift the input differential transmit signal $V_{TIP}/V_{TIN}$ to generate the output different transmit signal $V_{TOP}/V_{TON}$ in a higher voltage domain suitable for transmission to the receiver 130 via the transmission line 120.

The receiver 130 includes a differential signal processing device 132 and a slicer 134. The differential signal processing device 132 is configured to receive an input differential receive signal $V_{RIP}/V_{RIN}$ via the transmission line 120 and generate an output differential receive signal $V_{ROP}/V_{RON}$. The input differential receive signal $V_{RIP}/V_{RIN}$ is the output differential transmit signal $V_{TOP}/V_{TON}$ after propagating through transmission line 120. As such, the transmission line 120 is configured as a differential transmission line 120, which may include a first electrically-conductive trace disposed on a printed circuit board (PCB) or substrate to carry the positive component $V_{TOP}$ of the output differential transmit signal, and a second electrically-conductive traced disposed on the PCB or substrate to carry the negative component $V_{TON}$ of the output differential transmit signal.

Figure 1B:
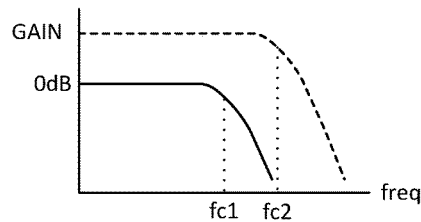
FIG. 1B illustrates a graph of exemplary frequency responses of a transmission line and a combination of the transmission line and a receiver front-end in accordance with another aspect of the disclosure.

FIG. 1B illustrates a graph of exemplary frequency responses of a transmission line and a combination of the transmission line and a receiver front-end in accordance with another aspect of the disclosure. In particular, the solid-line represents the frequency response of the transmission line 120. As illustrated, the transmission line 120 has a frequency response similar to a low pass filter. That is, the transmission line 120 is characterized as having relatively low signal loses (e.g., <3 dB of loss) for frequencies below a cutoff frequency fc1. Above the cutoff frequency fc1, the signal loss increases monotonically.

The rate that data can be accurately transmitted from the transmitter 110 to the receiver 130 depends on the effective cutoff frequency. Higher effective cutoff frequency translates to higher data rates; and lower effective cutoff frequency translates to lower data rates. If the frequency or data of the output differential transmit signal $V_{TOP}/V_{TON}$ is at or above the effective cutoff frequency, the received differential signal $V_{RIP}/V_{RIN}$ becomes distorted (e.g., expands in the time domain due to the LPF frequency response), and may produce intersymbol interference.

Figure 1C:
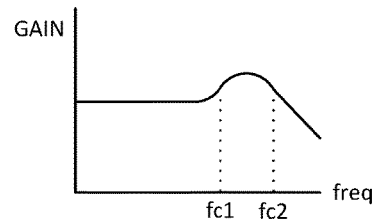
FIG. 1C illustrates a graph of exemplary frequency response of an exemplary differential signal processing device in accordance with another aspect of the disclosure.

FIG. 1C illustrates a graph of an exemplary frequency response of the differential signal processing device 132 in accordance with another aspect of the disclosure. The differential signal processing device 132, which may be configured as a variable gain amplifier (VGA), a continuous time linear equalizer (CTLE), or a VGA cascaded with a CTLE, performs amplification and equalization of the input differential received signal $V_{RIP}/V_{RIN}$ to generate the output differential received signal $V_{ROP}/V_{RON}$. As illustrated by the graph, the frequency response of the differential signal processing device 132 has generally a flat positive gain response for frequencies below the first cutoff frequency fc1, has a gain peak between the first cutoff frequency fc1 and a second cutoff frequency fc2, and a gain that monotonically decreases above the second cutoff frequency fc2.

With reference again to FIG. 1B, as a result of the gain-frequency response of the differential signal processing device 132, the frequency response of the transmission line 120 cascaded with the differential signal processing device 132 as depicted by the dashed line effectively extends the first cutoff frequency fc1 to the second cutoff frequency fc2. This allows the data rate of the output differential transmit signal $V_{TOP}/V_{TON}$ to be increased by correcting distortion at the front-end of the receiver 130. The slicer 134 then generates data based on the output differential received signal $V_{ROP}/V_{RON}$.

Figure 2:
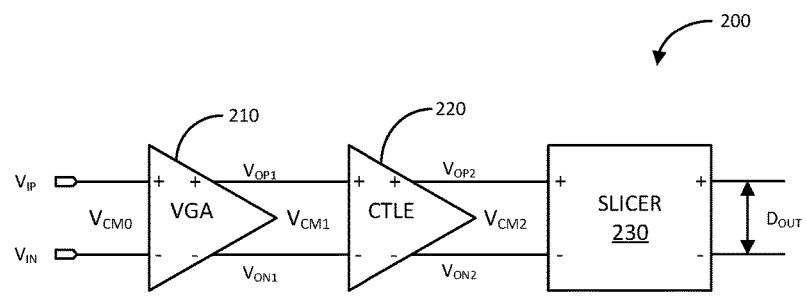
FIG. 2 illustrates a block diagram of an exemplary receiver in accordance with another aspect of the disclosure.

FIG. 2 illustrates a block diagram of an exemplary receiver 200 in accordance with another aspect of the disclosure. The receiver 200 may be a more detailed exemplary implementation of the receiver 100 previously discussed. In particular, the receiver 200 includes a differential variable gain amplifier (VGA) 210 cascaded with a differential continuous time linear equalizer (CTLE) 220, which, in turn, is cascaded with a differential slicer 230.

The VGA 210 includes a differential input configured to receive a differential signal $V_{IP}/V_{IN}$ from a remote transmitter via a transmission line, such as transmitter 110 and transmission line 120. The input differential signal $V_{IP}/V_{IN}$ has an associated common mode voltage $V_{CM0}$ that may vary due to the remote transmitter, transmission line and/or other factors. The common mode voltage $V_{CM0}$ may be given by the following equation:

$$V_{CM0} = \frac{(V_{IP} + V_{IN})}{2}$$

The VGA 210 amplifies the input differential signal $V_{IP}/V_{IN}$ with a particular gain-frequency response to generate a first output differential signal $V_{OP1}/V_{ON1}$. As alluded to above, the gain-frequency response of the VGA 210 may be characterized as having a substantially flat positive gain from low frequency to a cutoff frequency and then an enhanced or peak gain at a pole frequency above the cutoff frequency. The purpose of the enhanced gain at the pole or higher frequency is to compensate for high-frequency loses of the input differential signal $V_{IP}/V_{IN}$ due to propagation through the transmission line.

The first output differential signal $V_{OP1}/V_{ON1}$ has a common mode voltage $V_{CM1}$, which may be controlled to ensure that it is at an appropriate input level for the CTLE 220. The common mode voltage $V_{CM1}$ may be given by the following equation:

$$V_{CM1} = \frac{(V_{OP1} + V_{ON1})}{2}$$

The CTLE 220 receives the first output differential signal $V_{OP1}/V_{ON1}$ and applies a more complex equalization to better equalize the differential signal $V_{OP1}/V_{ON1}$ to counter combined adverse effects from the transmitter and transmission line, and remove intersymbol interference (ISI) so as to generate a second output differential signal $V_{OP2}/V_{OPN}$. The second output differential signal $V_{OP2}/V_{ON2}$ has a common mode voltage $V_{CM2}$, which needs to be controlled so that the slicer 230 can properly sample the differential signal $V_{OP2}/V_{ON2}$ to accurately generate a data signal $D_{OUT}$. Similarly, the common mode voltage $V_{CM2}$ may be given by the following equation:

$$V_{CM2} = \frac{(V_{OP2} + V_{ON2})}{2}$$

Figure 3:
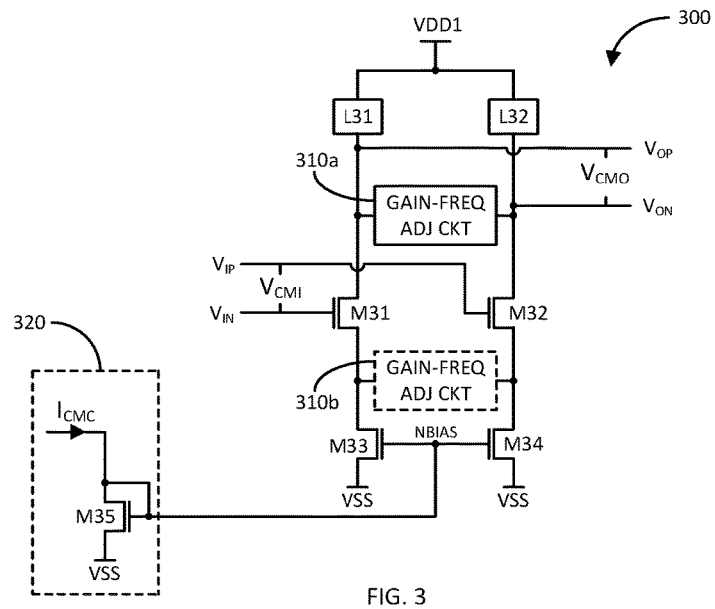
FIG. 3 illustrates a schematic diagram of an exemplary differential signal processing device in accordance with another aspect of the disclosure.

FIG. 3 illustrates a schematic diagram of an exemplary differential signal processing device 300 in accordance with another aspect of the disclosure. The differential signal processing device 300 represents a general differential signal processing circuit, such as a VGA, CTLE or other.

The differential signal processing device 300 includes a first load device L31, a first input transistor M31, and a first current source transistor M33 coupled in series between an upper voltage rail VDD1 and a lower voltage rail VSS (e.g., ground). The differential signal processing device 300 further includes a second load device L32, a second input transistor M32, and a second current source transistor M34 coupled in series between the upper voltage rail VDD1 and the lower voltage rail VSS. The transistors M31, M32, M33 and M34 may each be configured as an n-channel metal oxide semiconductor field effect transistor (NMOS FET).

Depending on the configuration, the differential signal processing device 300 may further include a gain-frequency response adjusting circuit 310a coupled across the drains of the input transistors M31 and M32. This may be the case for a particular CTLE implementation as discussed further herein. Or, the differential signal processing device 300 may further include a gain-frequency response adjusting circuit 310b coupled across the sources of the input transistors M31 and M32. This may be the case for a particular VGA implementation as discussed further herein. The gain-frequency response adjusting circuit 310a or 310b may include one or more variable or fixed capacitors and one or more variable or fixed resistors.

The differential signal processing device 300 is configured to receive an input differential signal $V_{IP}/V_{IN}$ at the gates of transistors M32 and M31, respectively. The input differential signal $V_{IP}/V_{IN}$ has an associated common mode voltage $V_{CMI}$. The differential signal processing device 300 is configured to generate an output differential signal $V_{OP}/V_{IN}$ at the drains of the input transistors M31 and M32, respectively. The output differential signal $V_{OP}/V_{ON}$ has an associated common mode voltage $V_{CMO}$.

Although not shown in FIG. 3, the output differential signal $V_{OP}/V_{ON}$ is applied to another differential signal processing device, such as a CTLE or a slicer. This device may be sensitive to the common mode voltage $V_{CMO}$ of the output differential signal $V_{OP}/V_{ON}$. For example, if the common mode voltage $V_{CMO}$ is not in a particular voltage range, the following device receiving the output differential signal $V_{OP}/V_{ON}$ may not operate properly. Thus, there is a need for controlling the common mode voltage $V_{CMO}$ of the output differential signal $V_{OP}/V_{ON}$.

In this regard, the differential signal processing device 300 further includes a local common mode voltage control circuit 320. The control circuit 320 includes a transistor M35 (e.g., an NMOS FET) including a drain configured to receive an external common mode control current $I_{CMC}$, a gate coupled to its drain, as well as to the gates of the current source transistors M33 and M34, and a source coupled to the lower voltage rail VSS. An external common mode voltage control circuit (shown in FIG. 4) supplies the common mode control current $I_{CMC}$ to set the common mode voltage $V_{CMO}$ of the output differential signal $V_{OP}/V_{ON}$ to a target common mode voltage to ensure proper operation by the following differential signal processing device.

In summary, the control of the common mode voltage $V_{CMO}$ of the output differential signal $V_{OP}/V_{ON}$ operates as follows: If the external common mode voltage control circuit determines that the common mode voltage $V_{CMO}$ of the output differential signal $V_{OP}/V_{ON}$ is below a target common mode voltage $V_{CMOT}$, the external common mode voltage control circuit decreases the common mode control current $I_{CMC}$. This causes the local common mode voltage control circuit 320 to decrease a bias voltage NBIAS applied to the gates of the current source transistors M33 and M34 so that the current through one or both of these transistors is decreased. As a result, there is less of a voltage drop across one or both of the load devices L31 and L32. This causes the common mode voltage $V_{CMO}$ of the output differential signal $V_{OP}/V_{ON}$ to increase towards the target common mode voltage $V_{CMOT}$.

If the external common mode voltage control circuit determines that the common mode voltage $V_{CMO}$ of the output differential signal $V_{OP}/V_{ON}$ is above the target common mode voltage $V_{CMOT}$, the external common mode voltage control circuit increases the common mode control current $I_{CMC}$. This causes the local common mode voltage control circuit 320 to increase the bias voltage NBIAS for the gates of the current source transistors M33 and M34 so that the current through one or both of these transistors is increased. As a result, there is more of a voltage drop across one or both of the load devices L31 and L32. This causes the common mode voltage $V_{CMO}$ of the output differential signal $V_{OP}/V_{ON}$ to decrease towards the target common mode voltage $V_{CMOT}$.

Figure 4:
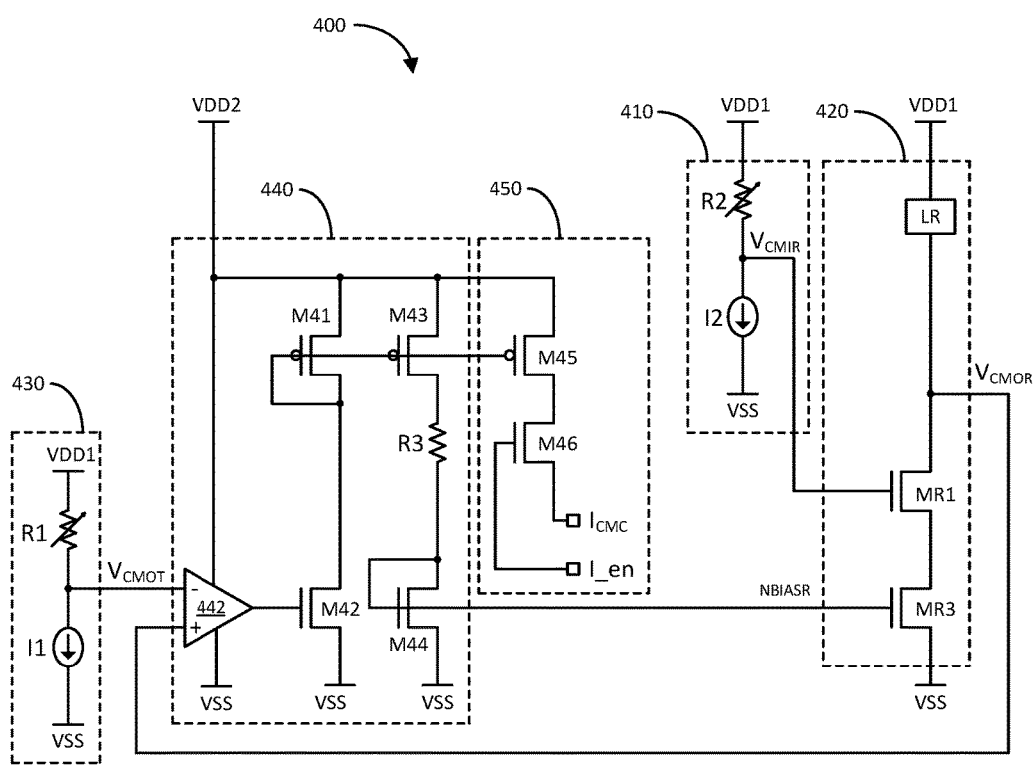
FIG. 4 illustrates a schematic diagram of an exemplary common mode voltage control circuit for the differential signal processing device of FIG. 3 in accordance with another aspect of the disclosure.

FIG. 4 illustrates a schematic diagram of an exemplary common mode voltage control circuit 400 in accordance with another aspect of the disclosure. The common mode voltage control circuit 400 may be a detailed implementation of the external common mode voltage control circuit previously mentioned. As discussed, the common mode voltage control circuit 400 generates the common mode control current $I_{CMC}$ for the local common mode voltage control circuit 320 for controlling the common mode voltage of the output differential signal $V_{OP}/V_{ON}$ generated by the differential signal processing device 300.

In particular, the common mode voltage control circuit 400 includes an input circuit 410, a replica circuit 420, a target common mode voltage setting circuit 430, a control feedback circuit 440, and an output circuit 450.

The input circuit 410 generates a replica input voltage $V_{CMIR}$, which is related or should emulate the common mode voltage $V_{CMI}$ of the input differential signal $V_{IP}/V_{IN}$ applied to the differential signal processing device 300. In this example, the input circuit 410 includes a variable resistor R2 coupled in series with a current source I2 between the first upper voltage rail VDD1 and the lower voltage rail VSS. The replica input voltage $V_{CMIR}$ is generated at a node between the variable resistor R2 and the current source I2. The replica input voltage $V_{CMIR}$ may be given by the following relationship:

$$V_{CMIR} = VDD1 - I2 \times R2$$

Where VDD1 represents the supply voltage on the first upper voltage rail VDD1, R2 represents the resistance of the variable resistor R2, and I2 represents the current generated by the current source I2. Thus, the resistance of the variable resistor R2 may be adjusted so that the replica input voltage $V_{CMIR}$ is substantially the same as the expected or actual common mode voltage $V_{CMI}$ of the input differential signal $V_{OP}/V_{ON}$. The current source I2 may be configured as a 1/R type current source so that the replica input voltage $V_{CMIR}$ is substantially invariant over process and temperature corners.

The replica circuit 420 is configured to generate a replica common mode voltage $V_{CMOR}$ that is substantially the same as the common mode voltage $V_{CMO}$ of the output differential signal $V_{OP}/V_{ON}$ of the differential signal processing device 300. The replica circuit 420 may be structurally the same as or a scaled down version of one side of the differential signal processing device 300. In particular, the replica circuit 420 includes a replica load device LR, a replica input transistor MR1 (e.g., an NMOS FET), and a replica current source transistor MR3 (e.g., an NMOS FET), all coupled in series between the first upper voltage rail VDD1 and the lower voltage rail VSS. The replica input voltage $V_{CMIR}$ generated by the input circuit 410 is applied to the gate of the replica input transistor MR1 to emulate the input differential signal $V_{IP}/V_{IN}$ being applied to the gates of the input transistors M32 and M31 of the differential signal processing device 300.

The replica common mode voltage $V_{CMOR}$ is generated at the drain of the input transistor MR1, similar to the output differential signal $V_{OP}/V_{ON}$ being generated at the drains of the input transistors M31/M32 of the differential signal processing device 300. The gate of the current source transistor MR3 receives a replica bias voltage NBIASR from the control feedback circuit 440 for controlling the current through the replica circuit 420; and consequently, controlling the replica common mode voltage $V_{CMOR}$ so that it is substantially the same as a target common mode voltage $V_{CMOT}$. In order to reduce power consumption and IC area, the replica circuit 420 may be a scaled down version of one side of the differential signal processing device 300. Thus, the size of the replica load device LR, replica input transistor MR1, and replica current source transistor MR3 may be scaled down by substantially the same size factor as the load device L31/L32, input transistor M31/M32, and current source transistor M33/M34 of the differential signal processing device 300.

The target common mode voltage setting circuit 430 generates the target common mode voltage $V_{CMOT}$ for the common mode voltage $V_{CMO}$ of the output differential signal $V_{OP}/V_{ON}$ of the differential signal processing device 300. In this example, the target common mode voltage setting circuit 430 includes a variable resistor R1 coupled in series with a current source I1 between the first upper voltage rail VDD1 and the lower voltage rail VSS. The target common voltage $V_{CMOT}$ is generated at a node between the variable resistor R1 and the current source I1. The target common voltage $V_{CMOT}$ may be given by the following relationship:

$$V_{CMOT} = VDD1 - I1 \times R1$$

Where VDD1 represents the supply voltage on the first upper voltage rail VDD1, R1 represents the resistance of the variable resistor R1, and I1 represents the current generated by the current source I1. Thus, the resistance of the variable resistor R1 may be adjusted to set the target common mode voltage $V_{CMOT}$ as desired. The current source I1 may also be configured as a 1/R type current source so that the target common voltage $V_{CMOT}$ is substantially invariant over process and temperature corners.

The control feedback circuit 440 is configured to compare the replica common mode voltage $V_{CMOR}$ with the target common mode voltage $V_{CMOT}$, and generate the replica bias voltage NBIASR based on the comparison to force the replica common mode voltage to be substantially the same as the target common mode voltage $V_{CMOT}$. In this example, the control feedback circuit 440 includes an operational amplifier 442, a first current generating path including transistor M41 (e.g., a p-channel metal oxide semiconductor (PMOS) FET) and transistor M42 (e.g., an NMOS FET), and a second current generating path including transistor M43 (e.g., a PMOS FET), resistor R3, and transistor M44 (e.g., an NMOS FET).

The operational amplifier 442 includes a negative input terminal configured to receive the target common mode voltage $V_{CMOT}$ from the target common mode voltage setting circuit 430. The operational amplifier 442 includes a positive input terminal configured to receive the replica common mode voltage $V_{CMOR}$ from the replica circuit 420. The operational amplifier 442 includes an output terminal configured to generate a voltage related to a difference between the replica common mode voltage $V_{CMOR}$ and the target common mode voltage $V_{CMOT}$. The operational amplifier 442 may be coupled between the first upper voltage rail VDD1 or, as shown, a second upper voltage rail VDD2 and the lower voltage rail VSS. The supply voltage on the second upper voltage rail VDD2 may be higher than the supply voltage on the first upper voltage rail VDD1 to provide more voltage headroom for the transistors coupled to the second voltage rail VDD2.

The first current generating path operates as a transconductance amplifier to generate a current related to the voltage generated by the operational amplifier 442. That is, the transistor M41 is coupled in series with transistor M42 between the second upper voltage rail VDD2 and the low voltage rail VSS. The transistor M41 is diode-connected with its gate coupled to its drain. The gate of transistor M42 is configured to receive the voltage generated by the operational amplifier 442. Thus, the current generated through transistors M41 and M42 is a function of the voltage generated by the operational amplifier 442.

The second current generating path is coupled to the first current generating path in a current mirror configuration. Thus, the current generated through the second current generating path is related to (e.g., substantially the same as) the current generated through the first current generating path. In particular, the transistor M43 is coupled in series with resistor R3 and transistor M44 between the second upper voltage rail VDD2 and the lower voltage rail VSS. The gate of transistor M43 is coupled to the gate of transistor M41 to establish the current mirror coupling between the first and second current generating paths. Thus, the current through transistor M43, resistor R3, and transistor M44 is related to (e.g., substantially the same as) the current through the first current generating path. As the transistor M44 is diode-connected by having its drain coupled to its gate, the transistor M44 operates as a transimpedance device to generate the replica bias voltage NBIASR based on the current through the second current generating path. As the control circuit 400 may be located remotely from the differential signal processing circuit 300, the resistor R3 (for all embodiments described herein) substantially replicates or is related to the resistance of the electrical conductor through which the common mode control current $I_{CMC}$ is sent from the control circuit 400 to the differential signal processing circuit 300 so that the replica bias voltage NBIASR is substantially the same as the bias voltage NBIAS.

The output circuit 450 is configured to selectively supply the common mode control current $I_{CMC}$ to the local common mode voltage control circuit 320 of the differential signal processing device 300. In this example, the output circuit 450 includes a transistor M45 (e.g., a PMOS FET) coupled in series with a transistor M46 (e.g., an NMOS FET) between the second upper voltage rail VDD2 and an output port through which the common mode control current $I_{CMC}$ is supplied to the local common mode voltage control circuit 320. The gate of the transistor M45 is coupled to the gates of transistors M41 and M43 so that the output circuit 450 is coupled to the first and second current generating paths in a current mirror configuration. Accordingly, the common mode control current $I_{CMC}$ is related to (e.g., substantially the same as) the currents generated through the first and second current generating paths, respectively. An enable signal I_en is applied to the gate of transistor M46 for selectively outputting the common mode control current $I_{CMC}$ by turning on or off the transistor M46.

The control or regulation of the replica common mode voltage $V_{CMOR}$ operates as follows: if the replica common mode voltage $V_{CMOR}$ is lower than the target common mode voltage $V_{CMOT}$, the operational amplifier 442 generates a lower voltage to reduce the currents through the first and second current generating paths. In response to the reduction in the current through the second current generating path, the transistor M44 generates a lower replica bias voltage NBIASR. This causes the current through the replica circuit 420 to decrease; thereby, causing the replica common mode voltage $V_{CMOR}$ to increase towards the target common mode voltage $V_{CMOT}$.

If the replica common mode voltage $V_{CMOR}$ is higher than the target common mode voltage $V_{CMOT}$, the operational amplifier 442 generates a higher voltage to raise the currents through the first and second current generating paths. In response to the raising of the current through the second current generating path, the transistor M44 generates a higher replica bias voltage NBIASR. This causes the current through the replica circuit 420 to increase; thereby, causing the replica common mode voltage $V_{CMOR}$ to decrease towards the target common mode voltage $V_{CMOT}$.

As the common mode control current $I_{CMC}$ is related to (e.g., substantially the same as) the current through the second current generating path, and the diode-connected transistor M44 generates the replica bias voltage NBIASR to ensure that the replica common mode voltage $V_{CMOR}$ is substantially the same as the target common mode voltage $V_{CMOT}$, the similarly-situated diode-connected transistor M35 of the local common mode voltage control circuit 320 generates the bias voltage NBIAS based on the common mode control current $I_{CMC}$. This causes the common mode voltage $V_{CMO}$ of the output differential signal $V_{OP}/V_{ON}$ to be substantially the same as the target common mode voltage $V_{CMOT}$.

The following describes more specific embodiments that apply the same principles of controlling the common mode voltage as discussed with reference to differential signal processing circuit 300 and its associated common mode voltage control circuit 400.

Figure 5:
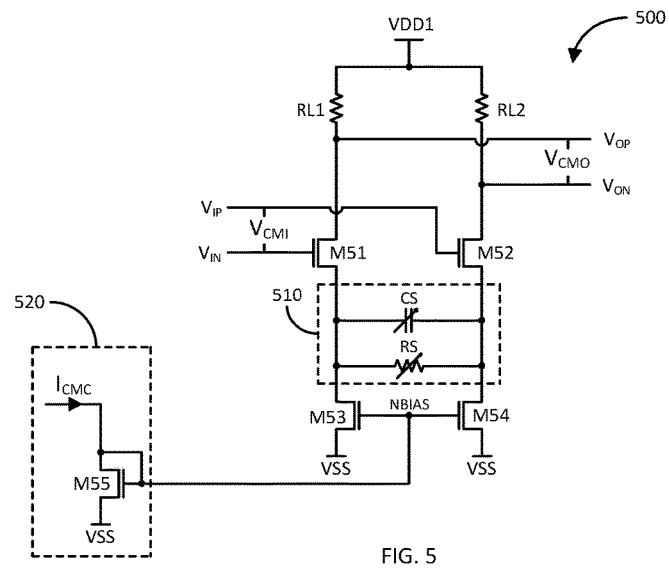
FIG. 5 illustrates a schematic diagram of an exemplary variable gain amplifier (VGA) in accordance with another aspect of the disclosure.

FIG. 5 illustrates a schematic diagram of an exemplary variable gain amplifier (VGA) 500 in accordance with another aspect of the disclosure. The VGA 500 is a more specific example of a differential signal processing device, such as the differential signal processing device 300 previously discussed. Basically, the same principles of controlling a common mode voltage $V_{CMO}$ of an output differential signal $V_{OP}/V_{ON}$ as discussed in detail with reference to the differential signal processing device 300 also applies to the VGA 500.

In particular, the VGA 500 includes a first load resistor RL1, a first input transistor M51, and a first current source transistor M53 coupled in series between an upper voltage rail VDD1 and a lower voltage rail VSS (e.g., ground). The VGA 500 further includes a second load resistor RL2, a second input transistor M52, and a second current source transistor M54 coupled in series between the upper voltage rail VDD1 and the lower voltage rail VSS. The transistors M51, M52, M53 and M54 may each be configured as NMOS FETs.

The VGA 500 further includes a gain-frequency response adjusting circuit 510 coupled across the sources of the input transistors M51 and M52. The gain-frequency adjusting circuit 510 includes a variable capacitor CS and a variable resistor RS coupled in parallel between the sources of the input transistors M51 and M52. Adjustment of the capacitance of the variable capacitor CS and the resistance of the variable resistor RS controls the gain-frequency response of the VGA 500. The variable capacitor CS may be implemented with a varactor diode and/or a bank of selectable fixed capacitors. Similarly, the variable resistor RS may be implemented with a bank of selectable resistors.

The VGA 500 is configured to receive an input differential signal $V_{IP}/V_{IN}$ at the gates of the input transistors M52 and M51, respectively. The input differential signal $V_{IP}/V_{IN}$ has an associated common mode voltage $V_{CMI}$. The VGA 500 is configured to generate an output differential signal $V_{OP}/V_{IN}$ at the drains of the input transistors M51 and M52, respectively. The output differential signal $V_{OP}/V_{ON}$ has an associated common mode voltage $V_{CMO}$.

Although not shown in FIG. 5, the output differential signal $V_{OP}/V_{ON}$ may be applied to another differential signal processing device, such as a CTLE or a slicer. This device may be sensitive to the common mode voltage $V_{CMO}$ of the output differential signal $V_{OP}/V_{ON}$. For example, if the common mode voltage $V_{CMO}$ is not in a particular voltage range, the following device receiving the output differential signal $V_{OP}/V_{ON}$ may not operate properly. Thus, there is a need for controlling the common mode voltage $V_{CMO}$ of the output differential signal $V_{OP}/V_{ON}$.

In this regard, the VGA 500 further includes a local common mode voltage control circuit 520. The control circuit 520 includes a transistor M55 (e.g., an NMOS FET) including a drain configured to receive an external common mode control current $I_{CMC}$, a gate coupled to its drain, as well as to the gates of the current source transistors M53 and M54, and a source coupled to the lower voltage rail VSS. As discussed in detail with respect to the differential signal processing device 300, an external common mode voltage control circuit (shown in FIG. 6) supplies the common mode control current $I_{CMC}$ to cause the local common mode voltage control circuit 520 to generate a bias voltage NBIAS for the gates of the current source transistors M53 and M54. As discussed in more detail further herein, the bias voltage NBIAS sets the common mode voltage $V_{CMO}$ of the output differential signal $V_{OP}/V_{ON}$ to a target common mode voltage to ensure proper operation by the following differential signal processing device.

Figure 6:
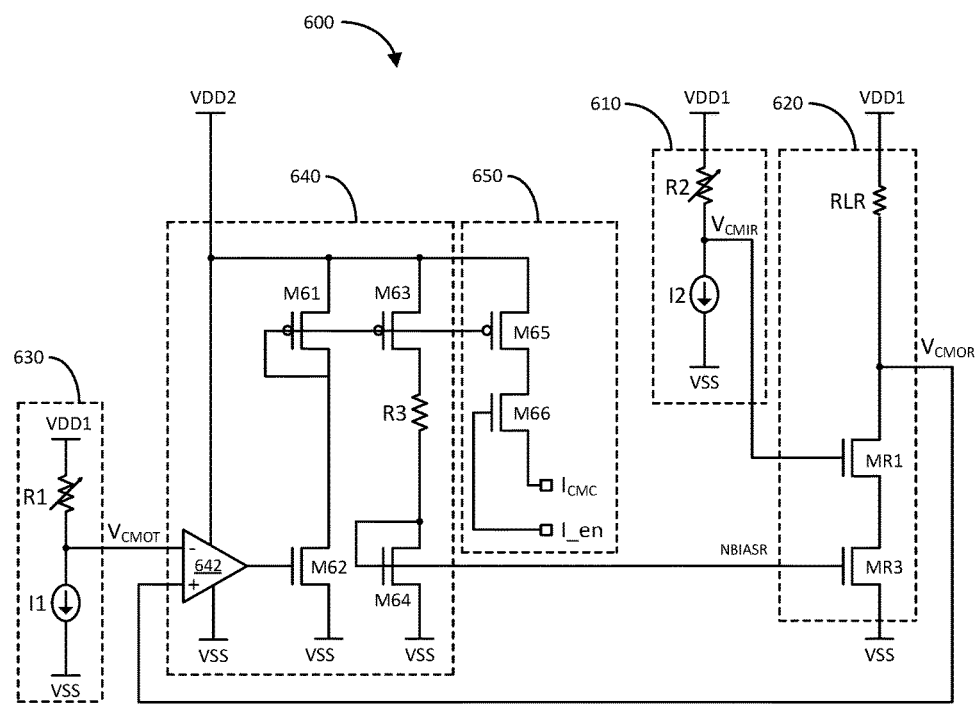
FIG. 6 illustrates a schematic diagram of an exemplary common mode voltage control circuit for the VGA of FIG. 5 in accordance with another aspect of the disclosure.

FIG. 6 illustrates a schematic diagram of an exemplary common mode voltage control circuit 600 for the VGA 500 in accordance with another aspect of the disclosure. The common mode voltage control circuit 600 is essentially the same as the common mode voltage control circuit 400 previously discussed in detail, with the exception that the circuit 600 includes a replica circuit of the VGA 500 instead of the general differential signal processing device 300. Accordingly, the same common mode voltage control principles as discussed in detail with respect to common mode voltage control circuit 400 applies to the common mode voltage control circuit 600.

In particular, the common mode voltage control circuit 600 includes an input circuit 610 configured to generate a replica input voltage $V_{CMIR}$, which may be substantially the same as the actual or estimate of the common mode voltage $V_{CMI}$ of the input differential signal $V_{IP}/V_{IN}$ to the VGA 500. Similar to the input circuit 410, the input circuit 610 includes a variable resistor R2 coupled in series with a current source I2 between the upper voltage rail VDD1 and the lower voltage rail VSS, wherein the replica input voltage $V_{CMIR}$ is generated at a node between the variable resistor R2 and the current source I2.

The common mode voltage control circuit 600 further includes a replica circuit 620 being substantially the same or a scaled version of one side of the VGA 500. In particular, the replica circuit 620 includes a replica load resistor RLR, a replica input transistor MR1 (e.g., an NMOS FET), and a replica current source transistor MR3 (e.g., an NMOS FET) coupled in series between the upper voltage rail VDD1 and the lower voltage rail VSS. The gate of the replica input transistor MR1 is configured to receive the replica input voltage $V_{CMIR}$ from the input circuit 610. The gate of the replica current source transistor MR3 is configured to receive a replica bias voltage NBIASR for controlling a current through the replica circuit 620. A replica common mode voltage $V_{CMOR}$ is generated at the drain of the input transistor MR1.

The common mode voltage control circuit 600 further includes a target common mode voltage generating circuit 630 configured to generate a target common mode voltage $V_{CMOT}$ for the common mode voltage $V_{CMO}$ of the output differential signal $V_{OP}/V_{ON}$ of the VGA 500. Similar to the target common mode voltage generating circuit 430, the circuit 630 includes a variable resistor R1 coupled in series with a current source I1 between the upper voltage rail VDD1 and the lower voltage rail VSS. The common target common mode voltage $V_{CMOT}$ is generated at a node between the variable resistor R1 and the current source I1.

The common mode voltage control circuit 600 further includes a control feedback circuit 640 for generating the replica bias voltage NBIASR for the gate of the replica current source transistor MR3 to control the current through the replica circuit 620 such that the replica common mode voltage $V_{CMOR}$ is substantially the same as the target common mode voltage $V_{CMOT}$. Similar to the control feedback circuit 440, the circuit 640 includes an operational amplifier 642, a first current generating path including transistor M61 (e.g., a PMOS FET) and transistor M62 (e.g., an NMOS FET), and a second current generating path including transistor M63 (e.g., a PMOS FET), resistor R3, and transistor M64 (e.g., an NMOS FET).

The operational amplifier 642 includes negative and positive input terminals configured to receive the target common mode voltage $V_{CMOT}$ and the replica common mode voltage $V_{CMOR}$, respectively. The operational amplifier 642 is coupled between an upper voltage rail VDD2 and the lower voltage rail VSS, wherein the upper voltage rail VDD2 may be the same or a different voltage rail as VDD1. The output of the operational amplifier 642 is coupled to the gate of transistor M62.

The transistor M61 is diode-connected and coupled in series with the transistor M62 between the upper voltage rail VDD2 and the lower voltage rail VSS. The transistor M63 is coupled in series with diode-connected transistor M64 between the upper voltage rail VDD2 and the lower voltage rail VSS. The gate of transistor M63 is coupled to the gate of transistor M64 so that the second current generating path is coupled to the first current generating path in a current mirror configuration. The generation of the replica bias voltage NBIASR by the control feedback circuit 640 has been discussed in detail with respect to control feedback circuit 440.

The common mode voltage control circuit 600 further includes an output circuit 650 configured selectively generate and output the common mode control current $I_{CMC}$. Similar to the output circuit 450, the output circuit 650 includes a transistor M65 (e.g., a PMOS FET) coupled in series with a transistor M66 (e.g., an NMOS FET) between the upper voltage rail VDD2 and an output through which the common mode control current $I_{CMC}$ is supplied to the local common mode voltage control circuit 520 of the VGA 500. The gate of the transistor M65 is coupled to the gates of transistors M61 and M63 so that the output circuit 650 is coupled to the first and second current generating paths in a current mirror configuration. A current enable signal I_en is applied to the gate of transistor M66 to selectively output the common mode control current $I_{CMC}$.

As the common mode control current $I_{CMC}$ is related to (e.g., substantially the same as) the current through the second current generating path due to the current mirror configuration, and the diode-connected transistor M64 generates the replica bias voltage NBIASR to ensure that the replica common mode voltage $V_{CMOR}$ is substantially the same as the target common mode voltage $V_{CMOT}$, the similarly-situated diode-connected transistor M55 of the local common mode voltage control circuit 520 generates the bias voltage NBIAS based on the common mode control current $I_{CMC}$. This causes the common mode voltage $V_{CMO}$ of the output differential signal $V_{OP}/V_{ON}$ to be substantially the same as the target common mode voltage $V_{CMOT}$.

Figure 7:
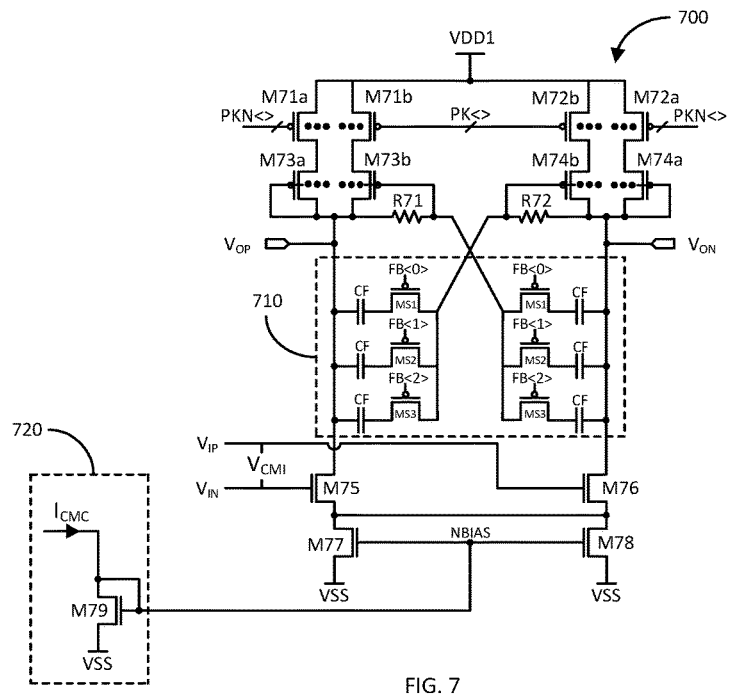
FIG. 7 illustrates a schematic diagram of an exemplary continuous time linear equalizer (CTLE) in accordance with another aspect of the disclosure.

FIG. 7 illustrates a schematic diagram of an exemplary continuous time linear equalizer (CTLE) 700 in accordance with another aspect of the disclosure. The CTLE 700 is another more specific example of a differential signal processing device, such as the differential signal processing device 300 previously discussed. Basically, the same principles of controlling a common mode voltage $V_{CMO}$ of an output differential signal $V_{OP}/V_{ON}$ as discussed in detail with reference to the differential signal processing device 300 also applies to the CTLE 700.

In particular, the CTLE 700 includes an active load including first and second sets of select transistors M71a-b (e.g., PMOS FETs), first and second sets of load transistors M73a-b (e.g., PMOS FETs), a first input transistor M75 (e.g., an NMOS FET), and a first current source transistor M77 (e.g., an NMOS FET) coupled in series between an upper voltage rail VDD1 and a lower voltage rail VSS (e.g., ground), respectively. The active load further includes third and fourth sets of select transistors M72a-b (e.g., PMOS FETs), third and fourth sets of load transistors M74a-b (e.g., PMOS FETs), a second input transistor M76 (e.g., an NMOS FET), and a second current source transistor M78 (e.g., an NMOS FET) coupled in series between the upper voltage rail VDD1 and the lower voltage rail VSS, respectively.

The first and third sets of load transistors M73a and M74a are diode-connected. The second and fourth sets of load transistors M73b and M74b include resistors R71 and R72 coupled between their gates and drains, respectively. The second and fourth sets of load transistors M73b and M74 exhibit a more inductance reactance as compared to the diode-connected transistors M73a and M74b. Based on a complementary control signal PK< > and PKN< >, the ratio between the number of active diode-connected transistors M73a and M74a compared to the number of active inductive-type transistors M73b and M74b may be controlled to configure the frequency response of the active load. The complementary control signal PK< > and PKN< > are applied to the gates of the second and fourth sets of transistors M71b and M72b and the gates of the first and third sets of transistors M71a and M72a, respectively. As an example, if the value of PK< > is 00000111, the ratio of diode-connected transistors to inductive-type transistors is three (3) to five (5).

The CTLE 700 further includes a gain-frequency response adjusting circuit 710 coupled across the drains of the input transistors M75 and M76. The gain-frequency adjusting circuit 710 includes a first set of capacitors CF and a first set of switches MS1-MS3 (e.g., PMOS FETs) coupled across the drains of the input transistors M76 and M75. Additionally, the gain-frequency adjusting circuit 710 includes a second set of capacitors CF and a second set of switches MS1-MS3 (e.g., PMOS FETs) coupled across the drains of the input transistors M75 and M76. The first and second switches MS1-MS3 are selectable via gate control signals FB<0>-FB<2> to control the gain-frequency response of the CTLE 700.

The CTLE 700 is configured to receive an input differential signal $V_{IP}/V_{IN}$ at the gates of the input transistors M76 and M75, respectively. The input differential signal $V_{IP}/V_{IN}$ has an associated common mode voltage $V_{CMI}$. The CTLE 700 is configured to generate an output differential signal $V_{OP}/V_{IN}$ at the drains of the input transistors M75 and M76, respectively. The output differential signal $V_{OP}/V_{ON}$ has an associated common mode voltage $V_{CMO}$. The sources of the input transistors M75 and M76 are shorted together in order to maximize the gain of the CTLE 700. Although it shall be understood that a resistor or variable resistor may be connected across the sources of the input transistors M75 and M76 to set the gain as desired.

Although not shown in FIG. 7, the output differential signal $V_{OP}/V_{ON}$ may be applied to another differential signal processing device, such as a sampler or slicer for generating data based on the output differential signal $V_{OP}/V_{ON}$. This sampler or slicer may be sensitive to the common mode voltage $V_{CMO}$ of the output differential signal $V_{OP}/V_{ON}$. For example, if the common mode voltage $V_{CMO}$ is not in a particular voltage range, the sampler or slicer may generate data with errors due to the common mode voltage $V_{CMO}$ not properly set or controlled. Thus, there is a need for controlling the common mode voltage $V_{CMO}$ of the output differential signal $V_{OP}/V_{ON}$.

In this regard, the CTLE 700 further includes a local common mode voltage control circuit 720. The control circuit 720 includes a transistor M79 (e.g., an NMOS FET) including a drain configured to receive an external common mode control current $I_{CMC}$, a gate coupled to its drain, as well as to the gates of the current source transistors M77 and M78, and a source coupled to the lower voltage rail VSS. As discussed in detail with respect to the differential signal processing device 300, an external common mode voltage control circuit (shown in FIG. 8) supplies the common mode control current $I_{CMC}$ to cause the local common mode voltage control circuit 720 to generate a bias voltage NBIAS for the gates of the current source transistors M77 and M78. As discussed in more detail further herein, the bias voltage NBIAS sets the common mode voltage $V_{CMO}$ of the output differential signal $V_{OP}/V_{ON}$ to a target common mode voltage to ensure proper operation by the following sampler or slicer.

Figure 8:
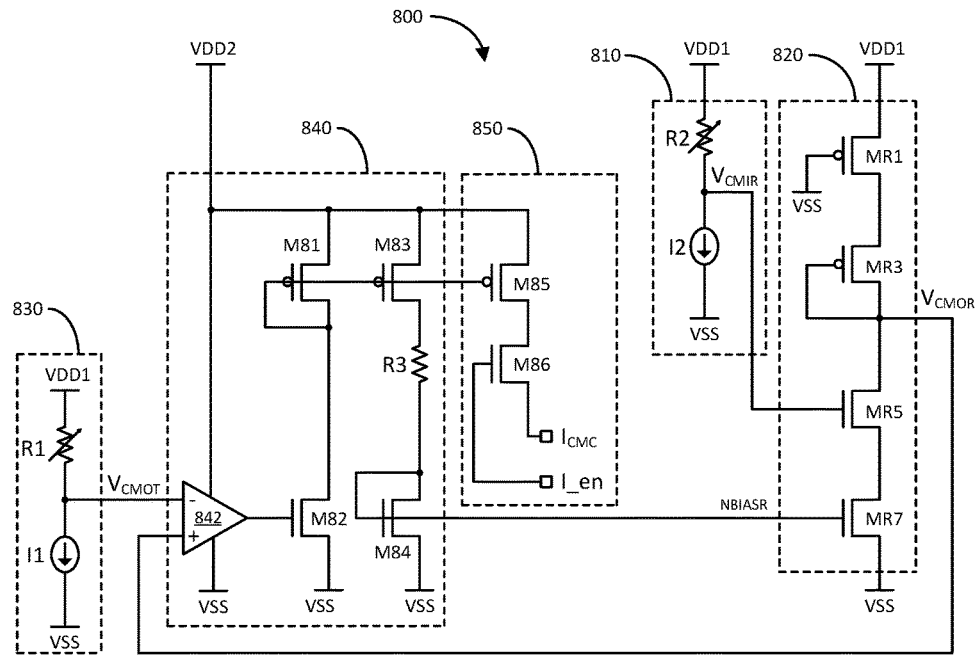
FIG. 8 illustrates a schematic diagram of an exemplary common mode voltage control circuit for the CTLE of FIG. 7 in accordance with another aspect of the disclosure.

FIG. 8 illustrates a schematic diagram of an exemplary common mode voltage control circuit 800 for the CTLE 700 in accordance with another aspect of the disclosure. The common mode voltage control circuit 800 is essentially the same as the common mode voltage control circuit 400 previously discussed in detail, with the exception that the circuit 800 includes a replica circuit of the CTLE 700 instead of the general differential signal processing device 300. Accordingly, the same common mode voltage control principles as discussed in detail with respect to common mode voltage control circuit 400 applies to the common mode voltage control circuit 800.

In particular, the common mode voltage control circuit 800 includes an input circuit 810 configured to generate a replica input voltage $V_{CMIR}$, which may be substantially the same as the actual or estimate of the common mode voltage $V_{CMI}$ of the input differential signal $V_{IP}/V_{IN}$ to the CTLE 700. Similar to the input circuit 410, the input circuit 810 includes a variable resistor R2 coupled in series with a current source I2 between the upper voltage rail VDD1 and the lower voltage rail VSS, wherein the replica input voltage $V_{CMIR}$ is generated at a node between the variable resistor R2 and the current source I2.

The common mode voltage control circuit 800 further includes a replica circuit 820 being substantially the same or a scaled version of one side of the CTLE 700. In particular, the replica circuit 720 includes a replica select transistor MR1 (e.g., a PMOS FET), a replica load transistor MR3 (e.g., a PMOS FET), a replica input transistor MR5 (e.g., an NMOS FET), and a replica current source transistor MR7 (e.g., an NMOS FET) coupled in series between the upper voltage rail VDD1 and the lower voltage rail VSS. The gate of the replica select transistor MR1 is coupled to the lower voltage rail VSS to configure the transistor in an ON state. The replica load transistor MR3 is diode-connected (e.g., its gate is coupled to its drain) similar to the load transistor M73a or M74a of the CTLE 700.

The gate of the replica input transistor MR5 is configured to receive the replica input voltage $V_{CMIR}$ from the input circuit 810. The gate of the replica current source transistor MR7 is configured to receive a replica bias voltage NBIASR for controlling a current through the replica circuit 820. A replica common mode voltage $V_{CMOR}$ is generated at the drain of the replica input transistor MR5.

The common mode voltage control circuit 800 further includes a target common mode voltage generating circuit 830 configured to generate a target common mode voltage $V_{CMOT}$ for the common mode voltage $V_{CMO}$ of the output differential signal $V_{OP}/V_{ON}$ of the CTLE 700. Similar to the target common mode voltage generating circuit 430, the circuit 830 includes a variable resistor R1 coupled in series with a current source I1 between the upper voltage rail VDD1 and the lower voltage rail VSS. The common target common mode voltage $V_{CMOT}$ is generated at a node between the variable resistor R1 and the current source I1.

The common mode voltage control circuit 800 further includes a control feedback circuit 840 for generating the replica bias voltage NBIASR for the gate of the replica current source transistor MR7 to control the current through the replica circuit 820 such that the replica common mode voltage $V_{CMOR}$ is substantially the same as the target common mode voltage $V_{CMOT}$. Similar to the control feedback circuit 440, the circuit 840 includes an operational amplifier 842, a first current generating path including transistor M81 (e.g., a PMOS FET) and transistor M82 (e.g., an NMOS FET), and a second current generating path including transistor M83 (e.g., a PMOS FET), resistor R3, and transistor M84 (e.g., an NMOS FET).

The operational amplifier 842 includes negative and positive input terminals configured to receive the target common mode voltage $V_{CMOT}$ and the replica common mode voltage $V_{CMOR}$, respectively. The operational amplifier 842 is coupled between an upper voltage rail VDD2 and the lower voltage rail VSS, wherein the upper voltage rail VDD2 may be the same or a different voltage rail than the upper voltage rail VDD1. The output of the operational amplifier 842 is coupled to the gate of transistor M82.

The transistor M81 is diode-connected and coupled in series with the transistor M82 between the upper voltage rail VDD2 and the lower voltage rail VSS. The transistor M83 is coupled in series with diode-connected transistor M84 between the upper voltage rail VDD2 and the lower voltage rail VSS. The gate of transistor M83 is coupled to the gate of transistor M84 so that the second current generating path is coupled to the first current generating path in a current mirror configuration. The generation of the replica bias voltage NBIASR by the control feedback circuit 840 has been discussed in detail with respect to control feedback circuit 440.

The common mode voltage control circuit 800 further includes an output circuit 850 configured selectively generate and output the common mode control current $I_{CMC}$. Similar to the output circuit 450, the output circuit 850 includes a transistor M85 (e.g., a PMOS FET) coupled in series with a transistor M86 (e.g., an NMOS FET) between the upper voltage rail VDD2 and an output through which the common mode control current $I_{CMC}$ is supplied to the local common mode voltage control circuit 720 of the CTLE 700. The gate of the transistor M85 is coupled to the gates of transistors M81 and M83 so that the output circuit 850 is coupled to the first and second current generating paths in a current mirror configuration. A current enable signal I_en is applied to the gate of transistor M86 to selectively output the common mode control current $I_{CMC}$.

As the common mode control current $I_{CMC}$ is related to (e.g., substantially the same as) the current through the second current generating path due to the current mirror configuration, and the diode-connected transistor M84 generates the replica bias voltage NBIASR to ensure that the replica common mode voltage $V_{CMOR}$ is substantially the same as the target common mode voltage $V_{CMOT}$, the similarly-situated diode-connected transistor M79 of the local common mode voltage control circuit 720 generates the bias voltage NBIAS based on the common mode control current $I_{CMC}$. This causes the common mode voltage $V_{CMO}$ of the output differential signal $V_{OP}/V_{ON}$ to be substantially the same as the target common mode voltage $V_{CMOT}$.

Figure 9:
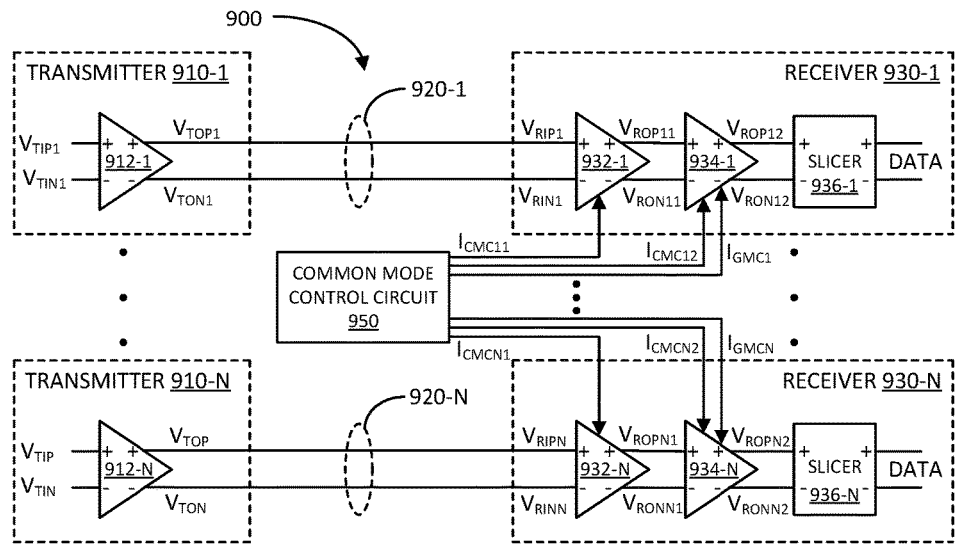
FIG. 9 illustrates a block diagram of another exemplary data communication system in accordance with an aspect of the disclosure.

FIG. 9 illustrates a block diagram of another exemplary data communication system 900 in accordance with an aspect of the disclosure. The 900 communication system includes N parallel data channels including transmitters 910-1 to 910-N coupled to receivers 930-1 to 930-N via differential transmission lines 920-1 to 920-N, respectively. The transmitters 910-1 to 910-N include I/O drivers 912-1 to 912-N configured to level shift input differential transmit signals $V_{TIP1}/V_{TIN1}$ to $V_{TIPN}/V_{TINN}$ to generate output differential transmit signals $V_{TOP1}/V_{TON1}$ to $V_{TOPN}/V_{TONN}$, respectively. The output differential transmit signals $V_{TOP1}/V_{TON1}$ to $V_{TOPN}/V_{TONN}$ are sent to the receivers 930-1 to 930-N via the differential transmission lines 920-1 to 920-N, respectively.

The receivers 930-1 to 930-N include VGAs 932-1 to 932-N, CTLEs 934-1 to 934-N, and slicers 936-1 to 936-N, respectively. The VGAs 932-1 to 932-N are configured to receive input differential receive signals $V_{RIP1}/V_{RIN1}$ to $V_{RIPN}/V_{RINN}$, respectively. The input differential receive signals $V_{RIP1}/V_{RIN1}$ to $V_{RIPN}/V_{RINN}$ are the output differential transmit signals $V_{TOP1}/V_{TON1}$ to $V_{TOPN}/V_{TONN}$ after propagating through the differential transmission lines 920-1 to 920-N, respectively. The VGAs 932-1 to 932-N amplify the input differential receive signals $V_{RIP1}/V_{RIN1}$ to $V_{RIPN}/V_{RINN}$ with certain gain-frequency responses to generate first output differential receive signals $V_{ROP11}/V_{RON11}$ to $V_{ROPN1}/V_{RONN1}$, respectively. The gain-frequency responses of the VGAs 932-1 to 932-N are configured to compensate for high frequency losses in the input differential receive signals $V_{RIP1}/V_{RIN1}$ to $V_{RIPN}/V_{RINN}$ due to propagating through the differential transmission lines 920-1 to 920-N, respectively.

The CTLEs 934-1 to 934-N are configured to amplify the first output differential receive signals $V_{ROP11}/V_{RON11}$ to $V_{ROPN1}/V_{RONN1}$ with certain gain-frequency responses to generate second output differential receive signals $V_{ROP12}/V_{RON12}$ to $V_{ROPN2}/V_{RONN2}$, respectively. The gain-frequency responses of the CTLEs 934-1 to 934-N are configured to perform a more aggressive high frequency loss compensation of the first output differential receive signals $V_{ROP11}/V_{RON11}$ to $V_{ROPN1}/V_{RONN1}$ to reduce intersymbol interference for more accurately generating data by the slicers 936-1 to 936-N, respectively. The slicers 936-1 to 936-N, in turn, generate data based on the output differential receive signals $V_{ROP12}/V_{RON12}$ to $V_{ROPN2}/V_{RONN2}$, respectively.

The data communication system 900 further includes a common mode control circuit 950 configured to generate a first set of common mode control currents $I_{CMC1}$ to $I_{CMCN1}$, a second set of common mode control currents $I_{CMC12}$ to $I_{CMCN2}$, and a set of transconductance gain control currents $I_{GMC1}$ to $I_{GMCN}$. The first set of common mode control currents $I_{CMC11}$ to $I_{CMCN1}$ are configured to control the common mode voltages of the first output differential receive signals $V_{ROP11}/V_{RON11}$ to $V_{ROPN1}/V_{RONN1}$ of the VGAs 932-1 to 932-N, respectively. The second set of common mode control currents $I_{CMC12}$ to $I_{CMCN2}$ are configured to control the common mode voltages of the second output differential receive signals $V_{ROP12}/V_{RON12}$ to $V_{ROPN2}/V_{RONN2}$ of the CTLE 934-1 to 934-N, respectively. The set of transconductance gain control currents $I_{GMC1}$ to $I_{GMCN}$ are configured to control the transconductance gains of the current source transistors of the CTLE 934-1 to 934-N, respectively. The centralized common mode control circuit 950, being capable of supplying common mode control currents, to a set of receivers 930-1 to 930-N, has the benefit of reducing IC footprint and power compared to schemes that employ a dedicated common mode voltage control circuit for each receiver.

Figure 10:
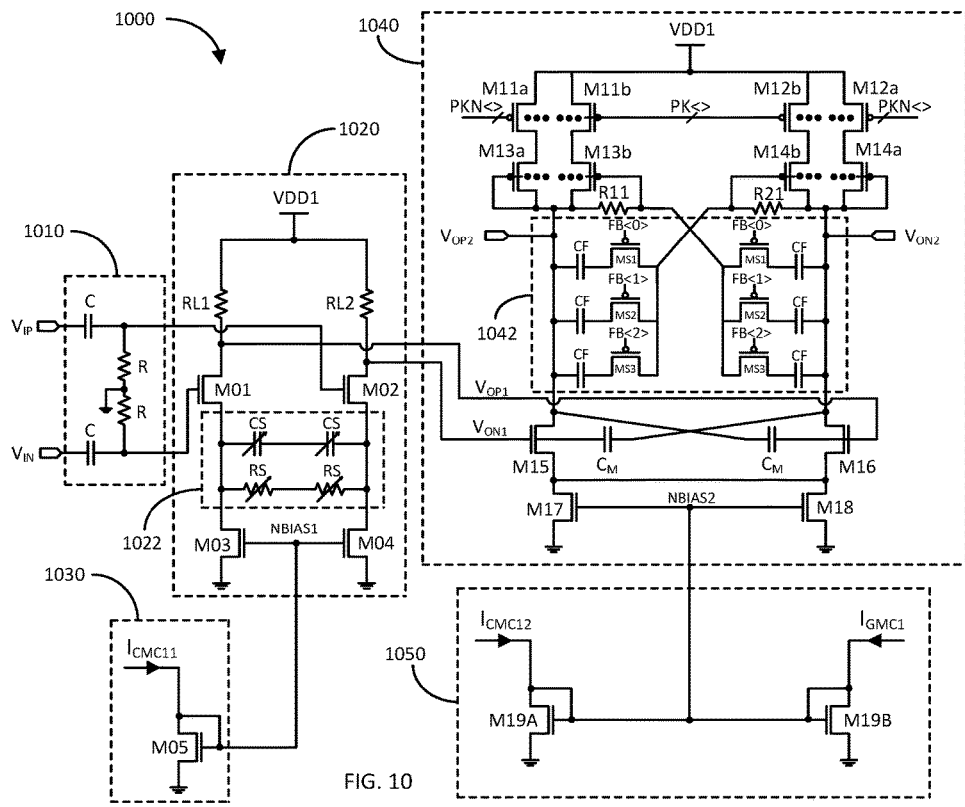
FIG. 10 illustrates a block diagram of another exemplary receiver in accordance with an aspect of the disclosure.

FIG. 10 illustrates a block diagram of another exemplary receiver 1000 in accordance with another aspect of the disclosure. The receiver 1000 may be an example of any one of the receivers 930-1 to 930-N of communication system 900 previously discussed. In particular, the receiver 100 includes an input circuit 1010, a VGA 1020 including a local common mode voltage control circuit 1030, and a CTLE 1040 including a local common mode voltage and transconductance gain control circuit 1050. For the sake of brevity, a differential slicer may be coupled to the output of the CTLE 1040, although the slicer is not shown in FIG. 10.

The input circuit 1010 is configured to decouple low frequency noise and components that may be present in an input differential signal $V_{IP}/V_N$ and also provide a termination impedance to better match the impedance of the input of the receiver 1010 to the characteristic impedance of the differential transmission lines through which the input differential signal $V_{IP}/V_{IN}$ is received. In this example, the input circuit 1010 includes a pair of capacitors C including first terminals configured to receive the input differential signal $V_{IP}/V_N$, respectively. The input circuit 1010 further includes a pair of resistors coupled between second terminals of the capacitors C and ground.

The VGA 1020 may be configured similar to VGA 500 previously discussed. That is, the VGA 1020 includes a first load resistor RL1, a first input transistor M01 (e.g., an NMOS FET), and a first current source transistor M03 (e.g., an NMOS FET), all coupled in series between an upper voltage rail VDD1 and a lower voltage rail (e.g., ground). The VGA 1020 includes a second load resistor RL2, a second input transistor M02 (e.g., an NMOS FET), and a second current source transistor M04 (e.g., an NMOS FET), all coupled in series between the upper voltage rail VDD1 and ground.

The VGA 1020 further includes a gain-frequency response adjustment circuit 1022 coupled across the sources of the input transistors M01 and M02. The gain-frequency response adjustment circuit 1022 includes one or more capacitors CS and one or more resistors RS coupled in parallel across the sources of the input transistors M01 and M02. The input circuit 1010 provides the input differential signal $V_{IP}/V_{IN}$ to the gates of the input transistors M02 and M01, respectively. The VGA 1020 is configured to generate a first output differential signal $V_{OP1}/V_{ON1}$ at the drains of the input transistors M01 and M02, respectively.

Similar to local common mode voltage control circuit 520, the control circuit 1030 is configured to receive a common mode control current $I_{CMC11}$, and generate therefrom, a first bias voltage NBIAS1 for the current source transistors M03 and M04 of the VGA 1020. The local common mode voltage control circuit 520 includes a diode-connected transistor M05 with a drain configured to receive the common mode control current $I_{CMC11}$, a gate coupled to its drain (to effectuate the diode-connection) as well as to the gates of the current source transistors M03 and M04, and a source coupled to ground. Similar to control circuit 520, the first bias voltage NBIAS1 controls the current through the VGA 1020 based on the common mode control current $I_{CMC11}$ to set the common mode voltage of the first output differential signal $V_{OP1}/V_{ON1}$ to substantially a first target common mode voltage $V_{CMO}T1$.

The CTLE 1040 may be configured similar to CTLE 700 previously discussed. That is, the CTLE 1040 includes complementary and non-complementary select transistors M11a and M11b (e.g., one or more PMOS FETs including gates configured to receive complementary signal PKN< > and PK< >, respectively), a diode-connected and inductive-type (due to resistor R11) load transistors M13a and M13b, a first input transistor M15 (e.g., an NMOS FET), and a first current source transistor M17 (e.g., an NMOS FET), all coupled in series between the upper voltage rail VDD1 and ground. The CTLE 1040 further includes complementary and non-complementary select transistors M12a and M12b (e.g., one or more PMOS FETs including gates configured to receive complementary signal PKN< > and PK< >, respectively), a diode-connected and inductive-type (due to resistor R12) load transistors M14a and M14b, a second input transistor M16 (e.g., an NMOS FET), and a second current source transistor M18 (e.g., an NMOS FET), all coupled in series between the upper voltage rail VDD1 and ground.

The CTLE 1020 further includes a gain-frequency response adjustment circuit 1040 including a first set of capacitors CF, a first set of PMOS FET switches MS1-MS3 controlled by respective signals FB<0>-FB<2>, and a resistor R11 coupled across the drains of the input transistors M16 and M15. The gain-frequency response adjustment circuit 1040 further includes a second set of capacitors CF, a second set of PMOS FET switches MS1-MS3 controlled by respective signals FB<0>-FB<2>, and a resistor R12 coupled across the drains of the input transistors M15 and M16.

The CTLE 1040 may further include a capacitor $C_M$ coupled between the gate of transistor M15 and the drain of transistor M16, and another capacitor $C_M$ coupled between the gate of transistor M16 and the drain of transistor M15. These capacitors CM improve the impedance match between the output of the VGA 1020 and the input of the CTLE 1040. The sources of the input transistors M15 and M16 are shorted together in order to maximize the gain of the CTLE 1040. Although it shall be understood that a resistor or variable resistor may be connected across the sources of the input transistors M15 and M16 to set the gain as desired.

The local common mode voltage and transconductance gain control circuit 1050 controls the common mode voltage of the output differential signal $V_{OP2}/V_{ON2}$ of the CTLE 1040, as well as the transconductance gain of the current source transistors M17 and M18. In particular, the control circuit 1050 includes a first diode-connected transistor M19A (e.g., an NMOS FET) including a drain configured to receive a common mode control current $I_{CMC12}$, the drain being coupled to its gate, as well as to the gates of the current source transistors M17 and M18 of the CTLE 1040, and a source coupled to ground. Additionally, the control circuit 1050 includes a second diode-connected transistor M19B (e.g., an NMOS FET) including a drain configured to receive a transconductance gain control current $I_{GMC1}$, the drain being coupled to its gate, as well as to the gates of the current source transistors M17 and M18 of the CTLE 1040, and a source coupled to ground.

Both the transconductance gain control current $I_{GMC1}$ and the common mode control current $I_{CMC12}$ contribute to a generation of the bias voltage NBIAS2 at the gates of the current source transistors M17 and M18 of the CTLE 1040. The transconductance gain control current $I_{GMC1}$ causes the second bias voltage NBIAS2 to configure the current source transistors M18 and M19 to operate within a desired transconductance gain region. As previously discussed, the common mode control current $I_{CMC12}$ moves the second bias voltage NBIAS2 to cause the common mode voltage of the output differential signal $V_{OP2}/V_{ON2}$ of the CTLE 1040 to be substantially the same as a second target common mode voltage $V_{CMOT2}$.

Figure 11:
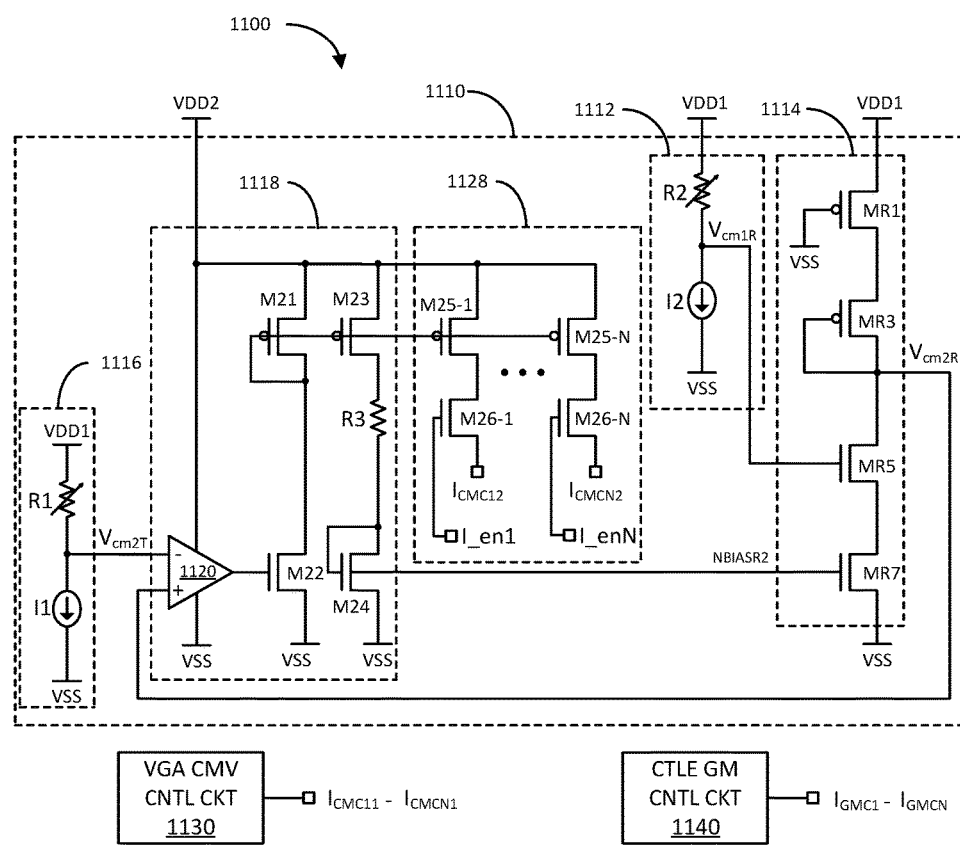
FIG. 11 illustrates a schematic diagram of an exemplary common mode voltage control circuit for the receiver of FIG. 10 in accordance with another aspect of the disclosure.

FIG. 11 illustrates a schematic diagram of another exemplary common mode voltage control circuit 1100 in accordance with another aspect of the disclosure. The common mode voltage control circuit 1100 is an exemplary detailed implementation of the common mode control circuit 950 of communication system 900 previously discussed.

In particular, the common mode voltage control circuit 1100 includes a CTLE common mode control voltage subcircuit 1110 for generating common mode control currents $I_{CMC12}$ and $I_{CMCN2}$ for controlling the common mode voltages of the output differential signals $V_{ROP12}/V_{RON12}$ to $V_{ROPN2}/V_{RONN2}$ of CTLEs 934-1 to 934-N, respectively. The control circuit 1100 may further include a VGA common mode voltage subcircuit 1130 for generating common mode control currents $I_{CMC11}$ and $I_{CMCN1}$ for controlling the common mode voltages of the output differential signals $V_{ROP11}/V_{RON11}$ to $V_{ROPN1}/V_{RONN1}$ of the VGAs 932-1 to 932-N, respectively. The subcircuit 1130 may be configured in detail similarly to the CTLE common mode voltage control subcircuit 1110. Additionally, control circuit 1100 includes a CTLE transconductance gain (GM) control circuit 1140 for generating the control currents $I_{GMC1}$ to $I_{GMCN}$ for setting the transconductance gain region of the current source transistors of the CTLEs 934-1 to 934-N, respectively.

The CTLE common mode voltage control subcircuit 1110 is similar to the common mode voltage control circuit 800 previously discussed, with the exception that it includes an output circuit that selectively supplies a set of common mode control currents $I_{CMC12}$ and $I_{CMCN2}$ for the set of CTLEs 934-1 to 934-N, respectively. Accordingly, the same common mode voltage control principles as discussed in detail with respect to common mode voltage control circuit 800 applies to the common mode voltage control subcircuit 1110.

In particular, the common mode voltage control subcircuit 1110 includes an input circuit 1112 configured to generate a replica input voltage $V_{CMIR}$, which may be substantially the same as the actual or estimate of one or a combination (e.g., average) of the common mode voltages of the first output differential receive signals $V_{ROP11}/V_{RON11}$ to $V_{ROPN1}/V_{RONN1}$ of the VGAs 932-1 to 932-N. Similar to the input circuit 810, the input circuit 1112 includes a variable resistor R2 coupled in series with a current source I2 between the upper voltage rail VDD1 and the lower voltage rail VSS, wherein the replica input voltage $V_{CM1R}$ is generated at a node between the variable resistor R2 and the current source I2.

The common mode voltage control subcircuit 1110 further includes a replica circuit 1114 being substantially the same as or a scaled version of one side of the CTLE 1040. In particular, the replica circuit 1114 includes a replica select transistor MR1 (e.g., a PMOS FET), a replica load transistor MR3 (e.g., a PMOS FET), a replica input transistor MR5 (e.g., an NMOS FET), and a replica current source transistor MR7 (e.g., an NMOS FET) coupled in series between the upper voltage rail VDD1 and the lower voltage rail VSS. The gate of the replica select transistor MR1 is coupled to the lower voltage rail VSS to configure the transistor in an ON state. The replica load transistor MR3 is diode-connected (e.g., its gate is coupled to its drain) similar to the second load transistor M13a or M14a of the CTLE 1040.

The gate of the replica input transistor MR5 is configured to receive the replica input voltage $V_{CM1R}$ from the input circuit 1112. The gate of the replica current source transistor MR7 is configured to receive a replica bias voltage NBIASR2 for controlling a current through the replica circuit 1114. A replica output voltage $V_{CM2R}$ is generated at the drain of the replica input transistor MR5.

The common mode voltage control subcircuit 1110 further includes a target common mode voltage generating circuit 1116 configured to generate a target common mode voltage $V_{CM2T}$ for the common mode voltages of the output differential signals $V_{ROP12}/V_{RON12}$ to $V_{ROPN2}/V_{RONN2}$ of CTLEs 934-1 to 934-N, respectively. Similar to the target common mode voltage generating circuit 830, the circuit 1116 includes a variable resistor R1 coupled in series with a current source I1 between the upper voltage rail VDD1 and the lower voltage rail VSS. The common target common mode voltage $V_{CM2T}$ is generated at a node between the variable resistor R1 and the current source I1.

The common mode voltage control subcircuit 1110 further includes a control feedback circuit 1118 for generating the replica bias voltage NBIASR2 for the gate of the replica current source transistor MR7 to control the current through the replica circuit 1114 such that the replica common mode voltage $V_{CM2R}$ is substantially the same as the target common mode voltage $V_{CM2T}$. Similar to the control feedback circuit 840, the circuit 1118 includes an operational amplifier 1120, a first current generating path including transistor M21 (e.g., a PMOS FET) and transistor M22 (e.g., an NMOS FET), and a second current generating path including transistor M23 (e.g., a PMOS FET), resistor R3, and transistor M24 (e.g., an NMOS FET).

The operational amplifier 1120 includes negative and positive input terminals configured to receive the target common mode voltage $V_{CM2T}$ and the replica common mode voltage $V_{CM2R}$, respectively. The operational amplifier 1120 is coupled between an upper voltage rail VDD2 and the lower voltage rail VSS, wherein the upper voltage rail VDD2 may be the same or a different voltage rail than the upper voltage rail VDD1. The output of the operational amplifier 1120 is coupled to the gate of transistor M22.

The transistor M21 is diode-connected and coupled in series with the transistor M22 between the upper voltage rail VDD2 and the lower voltage rail VSS. The transistor M23 is coupled in series with diode-connected transistor M24 between the upper voltage rail VDD2 and the lower voltage rail VSS. The gate of transistor M23 is coupled to the gate of transistor M21 so that the second current generating path is coupled to the first current generating path in a current mirror configuration. The generation of the replica bias voltage NBIASR2 by the control feedback circuit 1118 has been discussed in detail with respect to control feedback circuit 440.

The common mode voltage control circuit 1110 further includes an output circuit 1128 configured selectively generate and output the common mode control currents $I_{CMC12}$ to $I_{CMCN2}$. The output circuit 1128 includes a first set of transistors M25-1 to M25-N (e.g., each a PMOS FET) coupled in series with a second set of transistors M26-1 to M26-N (e.g., each an NMOS FET) between the upper voltage rail VDD2 and an output through which the common mode control currents $I_{CMC12}$ to $I_{CMCN2}$ are supplied to the local common mode voltage and transconductance gain control circuits of the CTLEs 934-1 to 934-N, respectively. The gates of the first set of transistors M25-1 to M25-N are coupled to the gates of transistors M21 and M23 so that the output circuit 1128 is coupled to the first and second current generating paths in a current mirror configuration. A set of current enable signals I_en1 to I_enN are applied to the gates of the second set of transistors M26-1 to M26-N to selectively output the common mode control current $I_{CMC12}$ to $I_{CMCN2}$, respectively.

As the common mode control currents $I_{CMC12}$ to $I_{CMCN2}$ are each related to (e.g., substantially the same as) the current through the second current generating path due to the current mirror configuration, and the diode-connected transistor M24 generates the replica bias voltage NBIASR2 to ensure that the replica common mode voltage $V_{CM2R}$ is substantially the same as the target common mode voltage $V_{CM2T}$, the similarly-situated diode-connected transistors (e.g., M19A) of the local common mode voltage control circuits (e.g., 1050) generate the bias voltages NBIAS2 based on the common mode control current $I_{CMC12}$ to $I_{CMCN2}$. This causes the common mode voltages of the output differential signal $V_{ROP12}/V_{RON12}$ to $V_{ROPN2}/V_{RONN2}$ to be substantially the same as the target common mode voltage $V_{CM2T}$.

Figure 12:
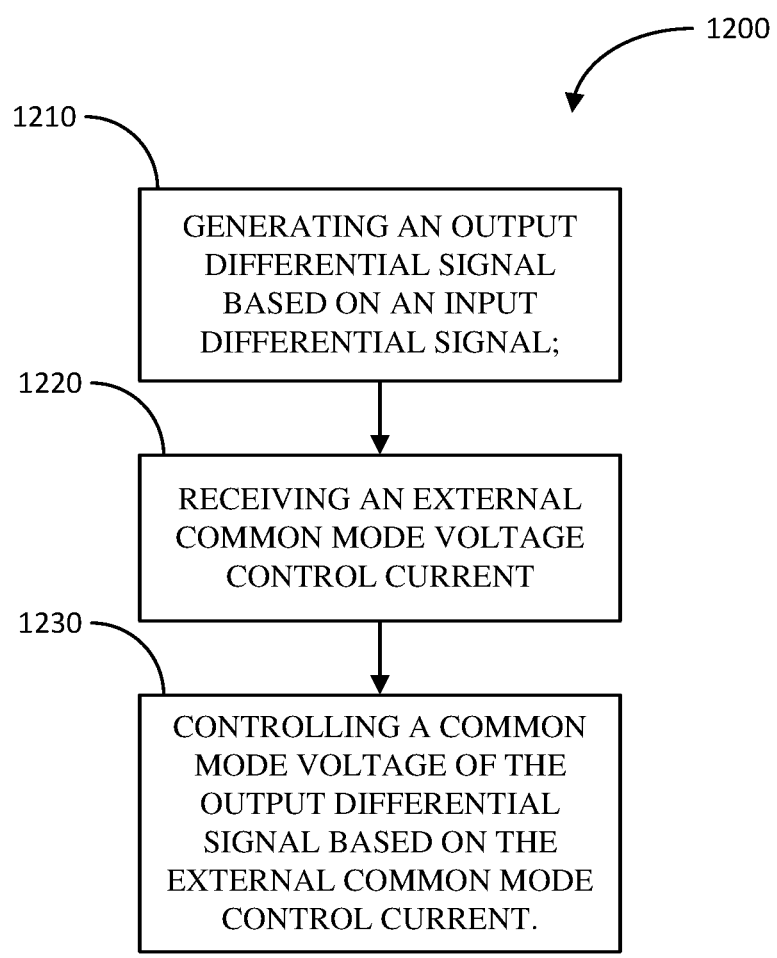
FIG. 12 illustrates a flow diagram of an exemplary method of controlling a common mode voltage for a differential signal processing device in accordance with another aspect of the disclosure.

FIG. 12 illustrates a flow diagram of an exemplary method 1200 of controlling a common mode voltage for a differential signal processing device in accordance with another aspect of the disclosure.

The method 1200 includes generating an output differential signal based on an input differential signal (block 1210). Examples of means for generating an output differential signal based on an input differential signal include any of the differential signal processing circuits 300, 500, 700, 932-1 to 932-N, 934-1 to 934-N, 1020 and 1040 described herein.

The method 1200 further includes receiving an external common mode voltage control current (block 1220). Examples of means for receiving an external common mode voltage control current include any of the local common mode voltage control circuits 320, 520, 720, 1030 and 1050 described herein.

The method 1200 further includes controlling a common mode voltage of the output differential signal based on the external common mode control current (block 1230). Examples of means for controlling a common mode voltage of the output differential signal based on the external common mode control current include any of the coupling of the local common mode voltage control circuits 320, 520, 720, 1030 and 1050 to the differential signal processing circuits 300, 500, 700, 1020 and 1030 for supplying the corresponding bias voltage to the current source transistors of the differential signal processing circuits, respectively.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
    a differential signal processing circuit comprising:
        a first load device, a first input transistor, and a first current source transistor coupled in series between a first upper voltage rail and a lower voltage rail, wherein the first input transistor includes a first gate configured to receive a positive component of an input differential signal and a first drain configured to produce a negative component of an output differential signal; and
        a second load device, a second input transistor, and a current control source transistor coupled in series between the first upper voltage rail and the lower voltage rail, wherein the second input transistor includes a second gate configured to receive a negative component of the input differential signal and a second drain configured to produce a positive component of the output differential signal;
    a local common mode voltage control circuit configured to receive an external common mode control current and generate therefrom a bias voltage for gates of the first and second current source transistors for setting a common mode voltage of the output differential signal to substantially a target common mode voltage; and
    an external common mode voltage control circuit configured to generate the external common mode control current.

2. The apparatus of claim 1, wherein the local common mode voltage control circuit comprises a transistor including a drain configured to receive the external common mode control current and a gate configured to produce the bias voltage.

3. The apparatus of claim 1, wherein the external common mode voltage comprises:
    an input circuit configured to generate a replica input voltage related to a common mode voltage of the input differential signal;
    a replica circuit configured to generate a replica common mode voltage based on the replica input voltage;
    a target common mode voltage setting circuit configured to generate the target common mode voltage;
    a control feedback circuit configured to generate a replica bias voltage to cause the replica common mode voltage to be substantially the same as the target common mode voltage; and
    an output circuit configured to generate the external common mode control current, wherein the external common mode control current is related to the replica bias voltage.

4. The apparatus of claim 3, wherein the input circuit comprises a variable resistor coupled in series with a current source between the first upper voltage rail and the lower voltage rail, wherein the replica input voltage is generated at a node between the variable resistor and the current source.

5. The apparatus of claim 3, wherein the replica circuit comprises a replica load device, a replica input transistor, and a replica current source transistor coupled in series between the first upper voltage rail and the lower voltage rail, wherein the replica input transistor includes a gate configured to receive the replica input voltage, and wherein the replica current source transistor includes a gate configured to receive the replica bias voltage.

6. The apparatus of claim 5, wherein the replica load device comprises a resistor.

7. The apparatus of claim 5, wherein the replica load device comprises at least one transistor.

8. The apparatus of claim 3, wherein the target common mode voltage setting circuit comprises a variable resistor coupled in series with a current source between the first upper voltage rail and the lower voltage rail, wherein the target common mode voltage is generated at a node between the variable resistor and the current source.

9. The apparatus of claim 3, wherein the control feedback circuit comprises:
    an operational amplifier configured to generate a voltage related to a difference between the replica common mode voltage and the target common mode voltage;
    a first current generating path configured to generate a first current based on the voltage; and
    a second current generating path configured to generate a second current based on the first current, wherein the second current generating path is coupled to the first current generating path via a current mirror configuration, and wherein the second current generating path is configured to generate the replica bias voltage.

10. The apparatus of claim 9, wherein the first current generating path comprises a diode-connected first transistor coupled in series with a second transistor between the first or a second upper voltage rail and the lower voltage rail, wherein the second transistor includes a gate configured to receive the voltage from the operational amplifier.

11. The apparatus of claim 10, wherein the second current generating path comprises a third transistor coupled in series with a diode-connected fourth transistor between the first or the second upper voltage rail and the lower voltage rail, wherein a gate of the third transistor is coupled to a gate of the diode-connected first transistor, and wherein the diode-connected fourth transistor includes a gate configured to produce the replica bias voltage.

12. The apparatus of claim 11, wherein the output circuit is configured to generate the external common mode control current based on at least one of the first or second current.

13. The apparatus of claim 12, wherein the output circuit comprises a fifth transistor coupled in series with a sixth transistor between the first or second upper voltage rail and an output port through which the external common mode control current is supplied to the local common mode voltage control circuit, wherein the fifth transistor includes a gate coupled to the gates of the diode-connected first transistor and the third transistor, and wherein the sixth transistor includes a gate configured to receive an enable signal for selectively outputting the external common mode control current via the output port.

14. The apparatus of claim 11, further comprising:
a second differential signal processing circuit configured to receive a second input differential signal and generate therefrom a second output differential signal; and
a second local common mode voltage control circuit configured to receive a second external common mode control current and generate therefrom a second bias voltage for gates of third and fourth current source transistors for the second differential signal processing circuit for setting a second common mode voltage of the second output differential signal to substantially the target common mode voltage.

15. The apparatus of claim 14, wherein the output circuit is configured to:
selectively generate the external common mode control current based on at least one of the first or second current; and
selectively generate the second external common mode control current based on at least one of the first or second current.

16. The apparatus of claim 15, wherein:
a fifth transistor coupled in series with a sixth transistor between the first or second upper voltage rail and a first output port through which the external common mode control current is supplied to the local common mode voltage control circuit, wherein the fifth transistor includes a gate coupled to the gates of the diode-connected first transistor and the third transistor, and wherein the sixth transistor includes a gate configured to receive a first enable signal for selectively outputting the external common mode control current via the first output port; and
a seventh transistor coupled in series with an eighth transistor between the first or second upper voltage rail and a second output port through which the second external common mode control current is supplied to the second local common mode voltage control circuit, wherein the seventh transistor includes a gate coupled to the gates of the diode-connected first transistor and the third transistor, and wherein the eighth transistor includes a gate configured to receive a second enable signal for selectively outputting the second external common mode control current via the second output port.

17. The apparatus of claim 1, further comprising a transconductance gain control circuit configured to receive a transconductance gain control current for controlling a transconductance gain of the first and second current source transistors, wherein the bias voltage is further based on the transconductance gain control current.

18. The apparatus of claim 17, wherein the transconductance gain control circuit comprises a transistor including a drain configured to receive the transconductance gain control current and a gate configured to contribute in the production of the bias voltage.

19. The apparatus of claim 1, further comprising:
a second differential signal processing circuit configured to generate the input differential signal based on a second input differential signal; and
a second local common mode voltage control circuit configured to receive a second external common mode control current and generate therefrom a second bias voltage for gates of third and fourth current source transistors of the second differential signal processing circuit for setting a second common mode voltage of the input differential signal to substantially a second target common mode voltage.

20. A method, comprising:
generating an output differential signal based on an input differential signal;
receiving an external common mode voltage control current;
controlling a common mode voltage of the output differential signal based on the external common mode control current; and
generating the external common mode control current, wherein generating the external common mode control current comprises:
generating a replica common mode voltage related to the common mode voltage of the output differential signal;
generating a target common mode voltage;
controlling the replica common mode voltage so that the replica common mode voltage is substantially the same as the target common mode voltage; and
generating the external common mode control current based on controlling the replica common mode voltage.

21. The method of claim 20, wherein controlling the common mode voltage of the output differential signal comprises:
generating a bias voltage based on the external common mode control current; and
controlling a current used for generating the output differential signal based on the bias voltage.

22. The method of claim 20, further comprising generating a replica input voltage related to a common mode voltage of the input differential signal, wherein generating the replica common mode voltage is based on the replica input voltage.

23. An apparatus, comprising:
means for generating an output differential signal based on an input differential signal;
means for receiving an external common mode voltage control current; and
means for controlling a common mode voltage of the output differential signal based on the external common mode control current; and means for generating the external common mode control current, wherein the means for generating the external common mode control current comprises:
- means for generating a replica common mode voltage related to the common mode voltage of the output differential signal;
- means for generating a target common mode voltage;
- means for controlling the replica common mode voltage so that the replica common mode voltage is substantially the same as the target common mode voltage; and
- means for generating the external common mode control current based on controlling the replica common mode voltage.

24. The apparatus of claim 23, wherein controlling the common mode voltage of the output differential signal comprises:
- means for generating a bias voltage based on the external common mode control current; and
- means for controlling a current used for generating the output differential signal based on the bias voltage.

25. The apparatus of claim 23, further comprising means for generating a replica input voltage related to a common mode voltage of the input differential signal, wherein the means for generating the replica common mode voltage comprises means for generating the replica common mode voltage based on the replica input voltage.

* * * * *